United States Patent
Ono et al.

(10) Patent No.: US 9,048,313 B2
(45) Date of Patent: Jun. 2, 2015

(54) SEMICONDUCTOR DEVICE THAT CAN MAINTAIN HIGH VOLTAGE WHILE LOWERING ON-STATE RESISTANCE

(75) Inventors: Syotaro Ono, Hyogo-ken (JP); Wataru Saito, Kanagawa-ken (JP); Toshiyuki Naka, Kanagawa-ken (JP); Shunji Taniuchi, Ishikawa-ken (JP); Hiroaki Yamashita, Hyogo-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 243 days.

(21) Appl. No.: 13/607,697

(22) Filed: Sep. 8, 2012

(65) Prior Publication Data

US 2013/0248988 A1 Sep. 26, 2013

(30) Foreign Application Priority Data

Mar. 23, 2012 (JP) ................ P2012-067427

(51) Int. Cl.
| | |
|---|---|
| H01L 29/66 | (2006.01) |
| H01L 29/78 | (2006.01) |
| H01L 21/02 | (2006.01) |
| H01L 29/06 | (2006.01) |
| H01L 29/423 | (2006.01) |
| H01L 29/10 | (2006.01) |

(52) U.S. Cl.
CPC ...... *H01L 29/7827* (2013.01); *H01L 21/02697* (2013.01); *H01L 29/42376* (2013.01); *H01L 29/4238* (2013.01); *H01L 29/7802* (2013.01); *H01L 29/7813* (2013.01); *H01L 29/0634* (2013.01); *H01L 29/0696* (2013.01); *H01L 29/1095* (2013.01)

(58) Field of Classification Search
None
See application file for complete search history.

(56) References Cited

U.S. PATENT DOCUMENTS

| | | |
|---|---|---|
| 6,849,880 B1 | 2/2005 | Saito et al. |
| 2002/0060330 A1 | 5/2002 | Onishi et al. |
| 2003/0224588 A1 | 12/2003 | Yamauchi et al. |
| 2004/0195618 A1 | 10/2004 | Saito et al. |
| 2006/0216896 A1* | 9/2006 | Saito et al. ............... 438/270 |
| 2009/0079002 A1* | 3/2009 | Lee et al. ................. 257/355 |
| 2010/0006931 A1* | 1/2010 | Denison ................... 257/334 |

FOREIGN PATENT DOCUMENTS

| | | |
|---|---|---|
| JP | 2000-252297 | 9/2000 |
| JP | 2002-083962 | 3/2002 |
| JP | 2005-085990 | 3/2005 |
| JP | 2007-012801 | 1/2007 |
| JP | 2007-266267 | 10/2007 |
| JP | 2010-210476 | 9/2010 |

OTHER PUBLICATIONS

Tatsuhiko Fujihira, Theory of Semiconductor Superjunction Devices, Jpn. J. Appl. Phys. vol. 36 (1997) pp. 6254-6262, Part 1, No. 10, Oct. 1997.

* cited by examiner

*Primary Examiner* — Davienne Monbleau
*Assistant Examiner* — Shaka White
(74) *Attorney, Agent, or Firm* — Patterson & Sheridan, LLP

(57) ABSTRACT

A semiconductor device includes a semiconductor substrate and a plurality of gate electrodes including a part extended in a first direction in a plane parallel with the semiconductor substrate. The semiconductor substrate has a second semiconductor layer including a plurality of first conductive type pillars and second conductive type second pillars that are disposed on the first semiconductor layer, extending in the first direction in the plane parallel with the semiconductor substrate and in a third direction intersecting with a second direction orthogonal to the first direction, and arranged adjacent to each other in an alternate manner.

20 Claims, 9 Drawing Sheets

SEMICONDUCTOR DEVICE THAT CAN MAINTAIN HIGH VOLTAGE WHILE LOWERING ON-STATE RESISTANCE

CROSS-REFERENCE TO RELATED APPLICATION

This application is based upon and claims the benefit of priority from Japanese Patent Application No. 2012-067427, filed Mar. 23, 2012, the entire contents of which are incorporated herein by reference.

FIELD

Embodiments described herein relate to a semiconductor device.

BACKGROUND

MOSFET's (metal-oxide-semiconductor field-effect transistor) or IGBT's (insulated gate bipolar transistor), which are broadly used as semiconductor devices for power, have a high-speed switching characteristic and a backward stopping voltage (withstand voltage) of tens to hundreds of V and are widely used in power conversion and control in electric home appliances, communication appliances, motors for vehicle mounting and the like. In order to achieve miniaturization, high efficiency, and reduced power consumption of these appliances, it is necessary to maintain high-voltage while lowering on-state resistance of the semiconductor devices.

DESCRIPTION OF THE DRAWINGS

FIG. 5A shows Modified Example 1, FIG. 5B shows a second modified example, and FIG. 5C shows a third modified example.

DETAILED DESCRIPTION

In general, according to one embodiment, an example will be explained below.

According to the embodiment, there is provided a semiconductor device that can hold high-voltage while lowering on-state resistance thereof.

According to an embodiment, the semiconductor device is provided with a semiconductor substrate, a plurality of gate electrodes that are installed on the semiconductor substrate and include a part extended in a first direction in a plane parallel with the semiconductor substrate, a gate insulating film installed between the semiconductor substrate and the gate electrodes, a first electrode connected to the upper surface of the semiconductor substrate, and a second electrode connected to the lower surface of the semiconductor substrate. The semiconductor substrate has a first conductive type first semiconductor layer connected to the second electrode, a second semiconductor layer including a plurality of first conductive type pillars and second conductive type pillars that are installed on the first semiconductor layer, extended in the first direction in the plane parallel with the semiconductor substrate and in a third direction intersecting with a second direction orthogonal to the first direction, and arranged adjacent to each other in an alternate manner, a second conductive type third conductor layer that is installed in a region including a gap between areas right under the gate electrodes on the second semiconductor layer, where an edge thereof is positioned in an area right under the gate electrodes from a top view, and a first conductive type fourth semiconductor layer that is installed in an area right on the third semiconductor layer and connected to the first electrode, where an edge thereof is positioned in an area right under the gate electrode from a top view.

Embodiment 1

Next, embodiments of the present disclosure will be explained with reference to the figures.

First, Embodiment 1 will be explained.

Figure 1A:
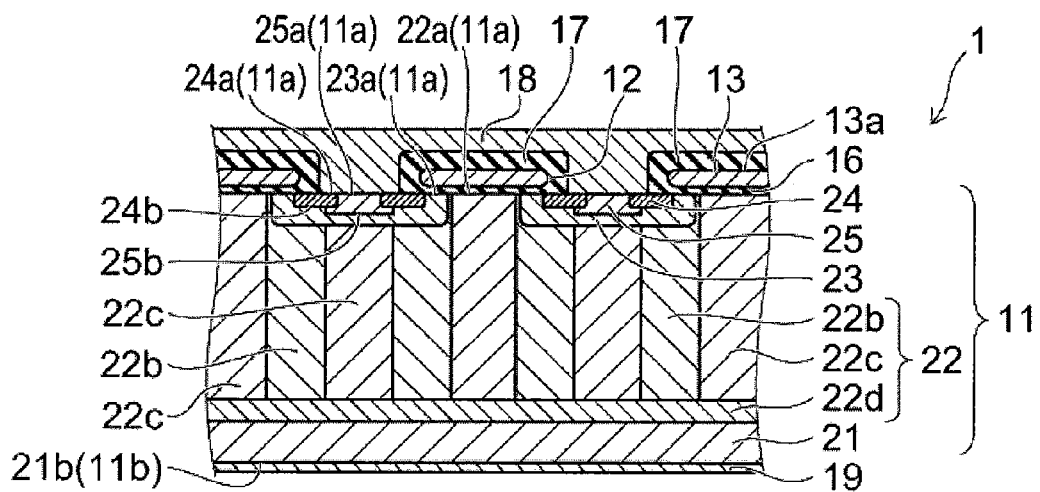
FIG. 1A is across section showing a semiconductor device according to a first embodiment.
Figure 1B:
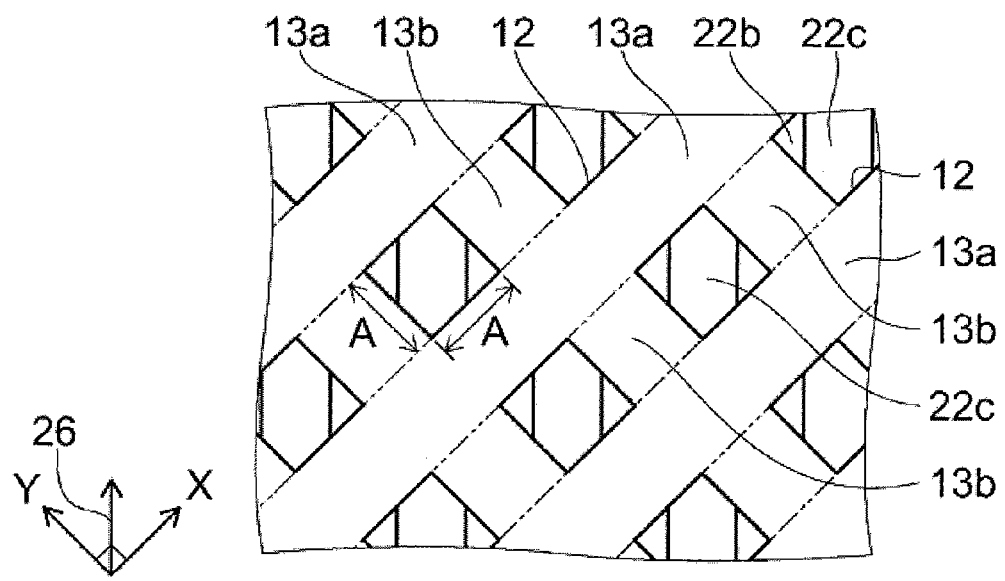
FIG. 1B is a plan view showing the semiconductor device of the first embodiment.

FIG. 1A is across section showing a semiconductor device of Embodiment 1, and FIG. 1B is a plan view showing the semiconductor device of Embodiment 1.

Figure 2A:
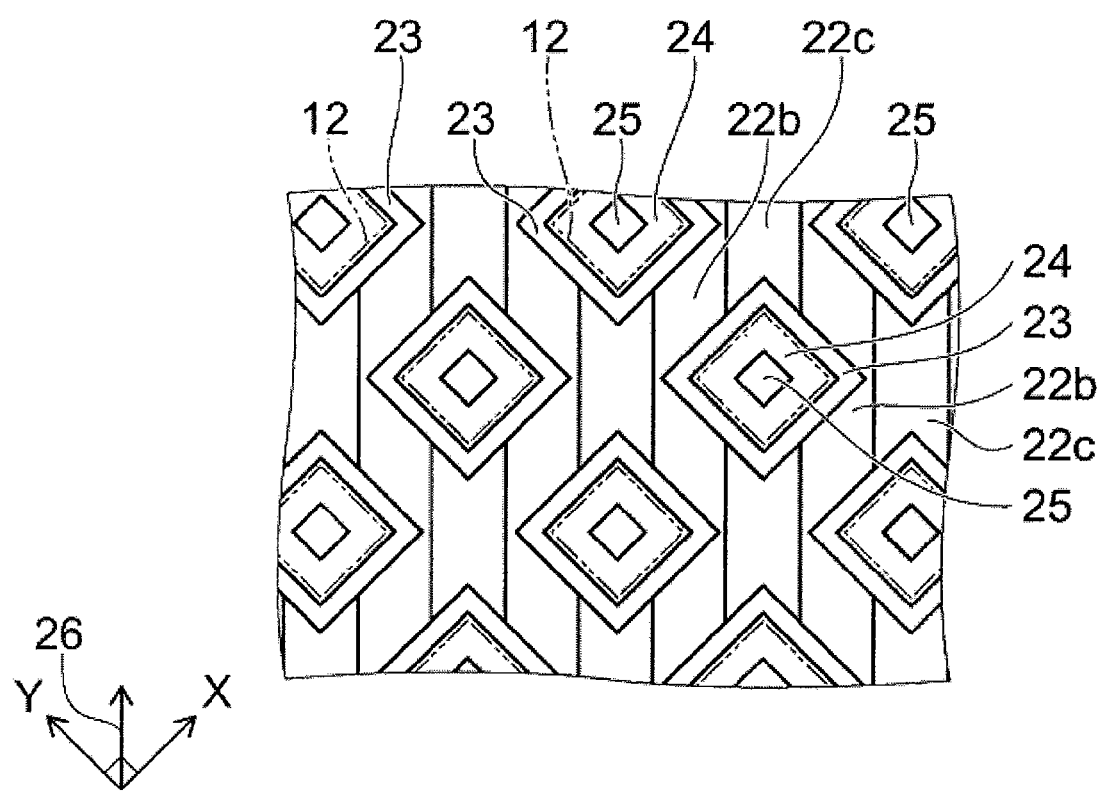
FIG. 2A and FIG. 2B are plan views showing the semiconductor device of the first embodiment.
Figure 2B:
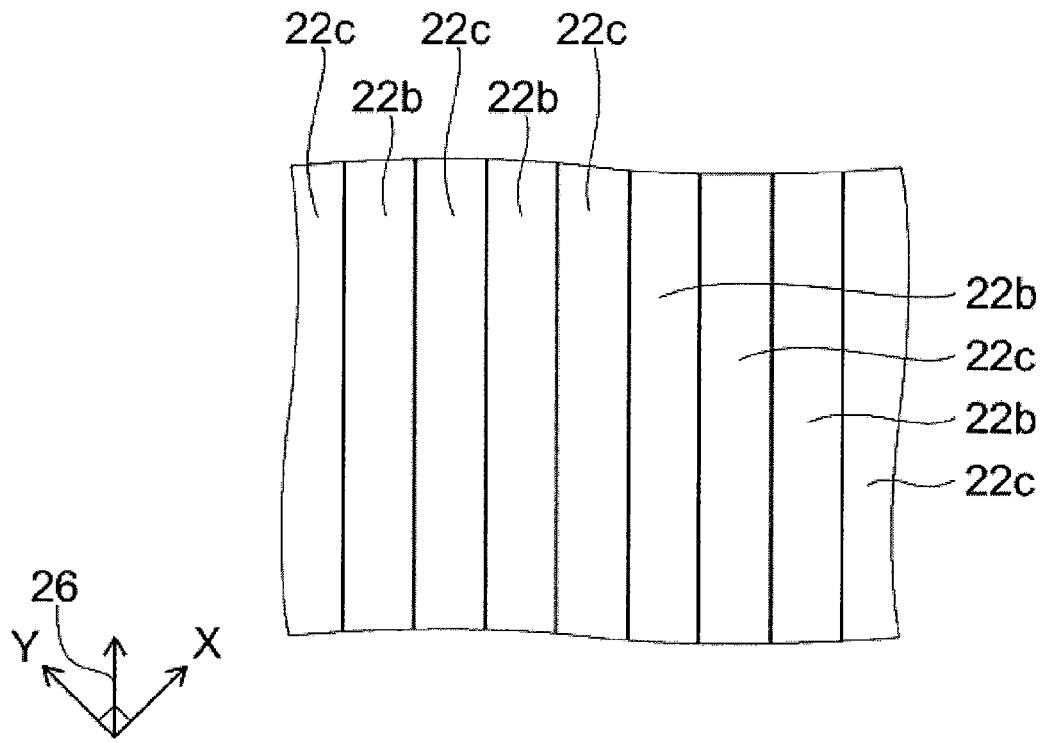

FIG. 2A and FIG. 2B are plan views showing the semiconductor device of Embodiment 1.

As shown in FIG. 1A, a semiconductor substrate 11 is installed in a semiconductor device 1 of this embodiment. The internal structure of the semiconductor substrate 11 will be described later. Next, constituent elements other than the semiconductor substrate 11 in the semiconductor device will be explained.

As shown in FIG. 1B in this specification, an XY orthogonal coordinate system is used to explain the semiconductor device 1. In this XY orthogonal coordinate system, the direction in a plane parallel with the upper surface of the semiconductor substrate 11 is assumed as the X direction. The direction orthogonal to the X direction is assumed as the Y direction.

A plurality of extended parts 13a extending in the X direction are installed at a fixed width on the upper surface of the semiconductor substrate 11. The extended parts 13a include a conductive material. The plurality of extended parts 13a are arranged at equal intervals in the Y direction. Between the adjacent extended parts 13a, a plurality connecting parts 13b extending in the Y direction are installed at a fixed width. The connecting parts 13b include a conductive material. The extended parts 13a adjacent to each other are electrically connected by the connecting parts 13b. The connecting parts 13b are arranged at equal intervals in the X direction. Contact holes 12 are formed by the extended parts 13a and the connecting parts 13b. Since both the extended parts 13a and the connecting parts 13b are arranged at equal intervals in the X and Y direction respectively, the contact holes 12 have a square shape in which the length of one side thereof is A.

Referring to FIG. 1A, between a gate electrode 13 and the substrate 11, a gate insulating film 16 is installed. In addition, an insulating film 17 is installed on the side surface facing the contact hole 12 in the gate electrode 13 and on the upper surface 13a of the gate electrode 13.

A source electrode 18 is installed so that the electrode covers the insulating film 17 and reaches the semiconductor substrate 11 via the contact hole 12. The source electrode 18, for example, is a metal film.

A drain electrode 19 is installed on a lower surface 11b of the semiconductor substrate 11. The drain electrode 19, for example, is a metal film and contacts with the entire lower surface 11b of the semiconductor substrate 11.

Next, the internal structure of the semiconductor substrate 11 will be explained.

The semiconductor substrate 11, for example, is a silicon substrate composed of a single crystal silicon.

The semiconductor substrate 11 includes a drain layer 21, drift layer 22, base layer 23, source layer 24, and hole discharge layer 25 are installed.

The drain layer 21 is disposed in the lower layer of the semiconductor substrate 11. Impurities as a donor, for example, phosphorus, are included in the drain layer 21. The conductive type of the drain layer 21 is n type.

The drift layer 22 is disposed on and in contact with the drain layer 21. The drift layer 22 includes n-layer 22d and a plurality of n type pillars 22b and p type pillars 22c.

The n-layer 22d is arranged on and in contact with the drain layer 21.

As shown in FIG. 1A and FIG. 1B and FIG. 2A and FIG. 2B, the n type pillars 22b and the p type pillars 22c are arranged at a certain width, adjacent to each other, in an alternate manner from the upper surface 11a of the semiconductor substrate 11 to the n-layer 22d below the gate electrodes 13, and extend in a direction 26 (FIG. 1b) at 45° to X direction and Y direction, respectively.

The n-layer 22d includes impurities as a donor, for example, phosphorus. The conductive type of the n-layer 22 is the n type. However, the effective impurity concentration of the n-type layer 22d is lower than the effective impurity concentration of the drain layer 21.

In this specification, "effective impurity concentration" means the concentration of impurities contributing to the electric conduction of a semiconductor material. For example, in the case that both impurities as a donor and impurities as an acceptor are included in the semiconductor material, the effective impurity concentration means the concentration from which a canceled part of the donor and the acceptor has been excluded.

The n type pillar 22b includes impurities as a donor, for example, phosphorus. The conductive type of the n type pillar 22b is n type. However, the effective impurity concentration of the n type pillar 22b is lower than the effective impurity concentration of the drain layer 21. In the p type pillar 22c, impurities as an acceptor, for example, boron are included. The conductive type of the pillar 22c is p type. With the arrangement of the n type pillars 22b and the p type pillars 22c in an alternate manner, a super junction structure (hereinafter, referred to as "SJ structure") is realized.

The base layer 23 is disposed in a region including an area directly under the contact hole 12 on the drift layer 22. That is, the base layer 23 is disposed in a region including a gap between the areas right under the extended parts 13a and the connecting parts 13b of the gate electrodes 13. The area directly under the contact hole 12 means a region which includes the direction of the drain layer 21 among the directions orthogonal to the upper surface of the semiconductor substrate 11. In the base layer 23, impurities as an acceptor, for example, boron are included. The conductive type of the base layer 23 is p type. From a top view, the edge of the base layer 23 is disposed in an area right under of the extended parts 13a and the connecting parts 13b of the gate electrodes 13. In other words, referring to FIG. 2A, the shape of the base layer 23 is approximately a square shape from a top view. The base layer 23 is larger than the contact hole 12, and the contact hole 12 is positioned inside the base layer 23. The side surface of the base layer 23 is in contact with the upper layer of the drift layer 22.

The source layer 24 is arranged in an area right on the base layer 23. In the source layer 24, impurities as a donor, for example, phosphorus, are included. The conductive type of the source layer 24 is n type. The effective impurity concentration of the source layer 24 is higher than the effective impurity concentration of the n-layer 22d and the n type pillar 22b. From a top view, the shape of the source layer 24 is a frame shape, and the outer edge of the source layer 24 is positioned in an area right under the extended parts 13a and the connecting parts 13b of the gate electrodes 13. In other words, the region enclosed with the outer edge of the source layer 24 has a size larger than the contact hole 12 and has a size smaller than the base layer 23. The outer side surface of the source layer 24 contacts the upper layer of the base layer 23.

The hole discharge layer 25 is arranged so that the layer is enclosed by the inner side surface of the source layer 24. In other words, the source layer 24 is penetrated by the hole discharge layer 25 an area right on the base layer 23. In addition, the hole discharge layer 25 is arranged so as to include an area right on the p type pillar 22c. In the hole discharge layer 25, impurities as an acceptor, for example, boron, are included. The conductive type of the base layer 23 is p type. However, the effective impurity concentration of the hole discharge layer 25 is higher than the effective impurity concentration of the base layer 23 and the p type pillar 22c.

A lower surface 25b of the hole discharge layer 25 is positioned lower than a lower surface 24b of the source layer 24. The layer below the lower surface 24b of the source layer 24 is the hole discharge layer 25, which stretches out to an area right under the source layer 24. The lower surface 25b of the hole discharge layer 25 is connected to the base layer 23.

In an upper surface 11a of the semiconductor substrate 11, an upper surface 25a of the hole discharge layer 25 is enclosed with an upper surface 24a of the source layer 24. The upper surface 24a of the source layer 24 is enclosed with an upper surface 23a of the base layer 23. The upper surface 23a of the base layer 23 is enclosed with the upper surface 22a of the drift layer 22. The upper surface 22a of the drift layer 22 in the upper surface 11a of the semiconductor substrate 11 is arranged in an area right under the gate electrode 13.

The extended parts 13a and the connecting parts 13b in the upper surface 24a of the source layer 24 are covered with an insulating film 17 arranged on the sides of the gate electrodes 13. The hole discharge layer 25 in the upper surface 24a is not covered with the insulating film 17. Part of the side of the hole discharge layer 25 in the upper surface 24a and the upper surface 25a of the hole discharge layer 25 contact the source electrode 18. The lower surface 21b of the drain layer 21 contacts the drain electrode 19.

Next, the operation of the semiconductor device of this embodiment will be explained.

In the semiconductor device 1, a power supply potential of the source electrode 18 is applied to the drain electrode. Depletion layers are generated from the interface of the n type pillars 22b and the base layer 23 and each interface of the n type pillars 22b and the p type pillars 22c. The depletion layer generated from the interface of the n type pillars 22b and the base layer 23 extends in the vertical direction from the interface and spreads over a prescribed width in the n type pillars 22b and the base layer 23. The depletion layer generated from the interface of the n type pillars 22b and the p type pillars 22c extends from the interface in both directions of the n type pillars 22b side and the p type pillars 22c side in the direction perpendicular to the interface and spreads over the entire drift layer 22.

In this state, if a potential higher than a threshold is applied to the gate electrodes 13, an inversion layer is formed in the vicinity of the gate insulating film 17 in the base layer 23, so that a current flows up to the source electrode 18 via the drain layer 21, the n type pillars 22b in the drift layer 22, the inversion layer in the base layer 23, and the source layer 24 from the drain electrode 19. On the other hand, if a potential lower than the threshold is applied to the gate electrodes 13, the inversion layer disappears, cutting off the current. When the semiconductor device 1 is turned off, holes existing in the semiconductor substrate 11 are discharged from the source electrode 18 via the hole discharge layer 25.

Next, the effects of this embodiment will be explained.

In this embodiment, the extended parts 13a of the gate electrodes 13 are arranged obliquely to the extending direction 26 of the n type pillars 22b and the p type pillars 22c. Therefore, at least a part of the respective n type pillars 22b are covered with the extended parts 13a. Thereby, each n type pillar 22b can be a current path. Accordingly, because of the SJ structure and the absence of the n type pillar 22b that cannot be a current path, a high-voltage can be held while lowering the on-state resistance of the semiconductor device 1.

In addition, with the arrangement of the extended parts 13a of the gate electrodes 13 obliquely to the direction 26, the area where the upper surfaces of the n type pillars 22b are covered by the extended parts 13a can be increased, compared to the case where the extended parts 13a and the direction 26 are orthogonal. Therefore, since the sectional area of the current path can be large, a high-voltage can be held while lowering the on-state resistance of the semiconductor device 1.

Regardless of the width of the n type pillars 22b, the width of the extended parts 13a can be increased. Therefore, the area where the extended parts 13a and the drain electrode 19 oppose to each other can be increased. Thereby, the gate capacitance can be increased, thus being able to reduce switching resistance.

Since the hole discharge layer 25 is formed so as to include an area right on top of the p type pillars 22c, the hole discharge effect can be improved.

In the gate electrode 13, includes connecting parts 13b in addition to the extended parts 13a. Therefore, the area where the upper surfaces of the n type pillars 22b are covered can be further increased, thus further lowering the on-state resistance of the semiconductor device 1.

The contact holes 12 in the grid-shaped gate electrodes 13 can be formed from the side surface along two directions of the X direction and the Y direction. Therefore, the gate electrodes 13 can be easily processed.

Comparative Example 1 of Embodiment 1

Next, Comparative Example 1 of Embodiment 1 will be explained.

Figure 3A:
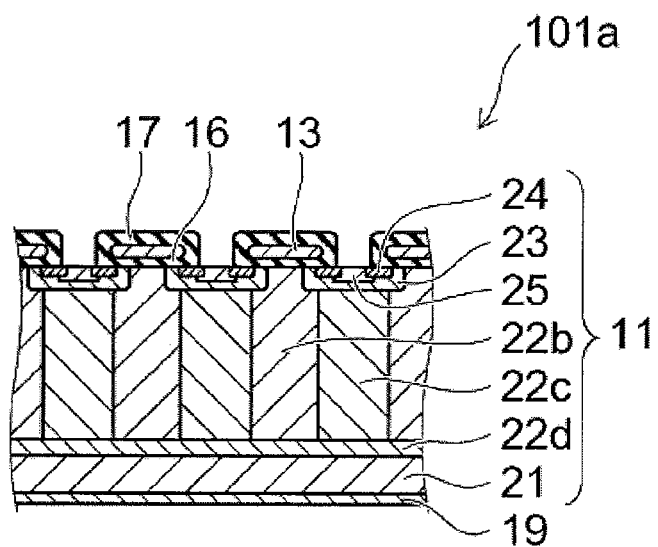
FIG. 3A is a cross section showing a semiconductor device of a first comparative example of the first embodiment.
Figure 3B:
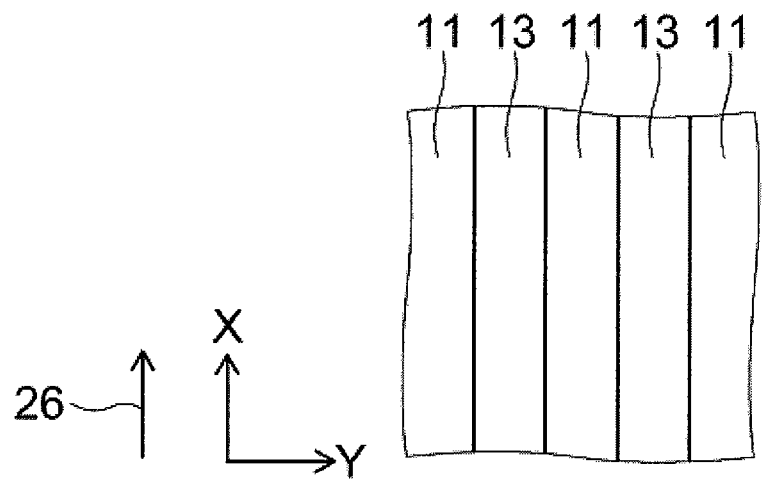
FIG. 3B and FIG. 3C are plan views showing the semiconductor device of the first comparative example of the first embodiment.
Figure 3C:
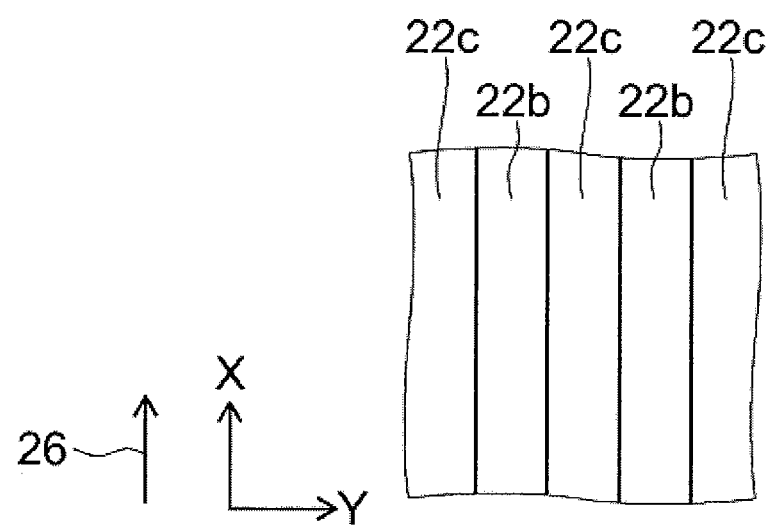

FIG. 3A is across section showing a semiconductor device of Comparative Example 1 of Embodiment 1, and FIG. 3B and FIG. 3C are plan views showing a semiconductor device of Comparative Example 1 of Embodiment 1.

As shown in FIG. 3A and FIG. 3B, in a semiconductor device 101a of this comparative example, the gate electrode 13 extends in one direction in a plane parallel with the upper surface of the semiconductor substrate 11.

In this comparative example, for the explanation of the semiconductor device 101a, an XY orthogonal coordinate axis system is used. In this XY orthogonal coordinate axis system, the extending direction of the gate electrodes 13 in the plane parallel with the upper surface of the semiconductor substrate 11 is assumed as the X direction. The direction orthogonal to the X direction is assumed as the Y direction.

The gate electrodes 13 are arranged at equal intervals in the Y direction.

As shown in FIG. 3C, the extending direction 26 of the n type pillars 22b and the p type pillars 22c are also in the X direction. In addition, the gate electrodes 13 are arranged on the n type pillars 22b. The width of the gate electrodes 13 is the same as that of the width of the n type pillars 22b.

As shown in FIG. 3A, the base layer 23 is disposed in a region including a gap between areas right under the gate electrode 13 on the drift layer 22. From a top view, the edge of the base layer 23 is positioned in an area right under the gate electrode 13. The source layer 24 is arranged in an area right on top of the base layer 23. The source layer 24 is disposed in an area under a side of the gate electrode 13. The side surface of the gate electrode 13 in the source layer 24 contacts the upper layer part of the base layer 23. In the gap between areas right under the gate electrode 13, the hole discharge layer 25 is arranged so as to be sandwiched by the side surfaces of the source layer 24. The hole discharge layer 25 is arranged on an area right on top of the p type pillars 22c. The lower surface of the hole discharge layer 25 is positioned lower than the lower surface of the source layer 24. The lower surface of the hole discharge layer 25 is connected to the base layer 23.

In the semiconductor device 101a of this comparative example, compared with the semiconductor device 1 of Embodiment 1, the area where the gate electrodes 13 and the drain electrode 19 oppose to each other is smaller. Therefore, the gate capacitance in the semiconductor device 101a is smaller than the gate capacitance in the semiconductor device 1. For this reason, switching resistance is higher as compared with the semiconductor device 1.

Comparative Example 2 of Embodiment 1

Next, Comparative Example 2 of Embodiment 1 will be explained.

Figure 4A:
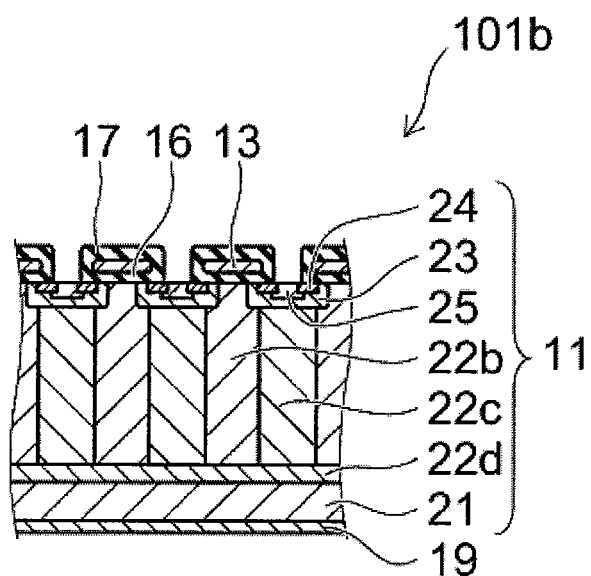
FIG. 4A is across section showing a semiconductor device of a second comparative example of the first embodiment.
Figure 4B:
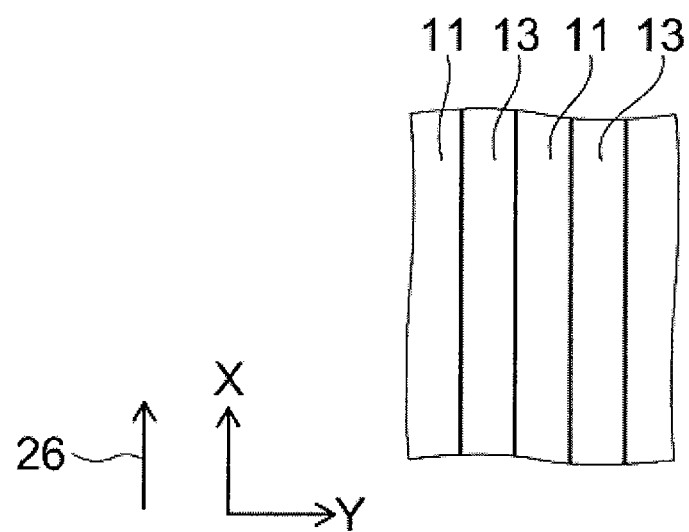
FIG. 4B and FIG. 4C are plan views showing the semiconductor device of the second comparative example of the first embodiment.
Figure 4C:
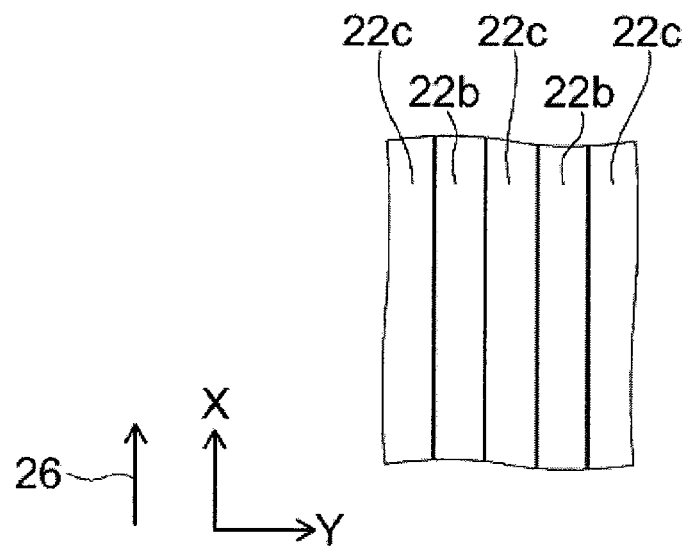

FIG. 4A is a cross section showing a semiconductor device of Comparative Example 2 of Embodiment 1, and FIG. 4B and FIG. 4C are plan views showing the semiconductor device of Comparative Example 2 of Embodiment 1.

As shown in FIGS. 4A to 4C, in a semiconductor device 101b of this comparative example, similar to Comparative Example 1, then type pillars 22b, p type pillars 22c, and gate electrodes 13 also extend in one direction in a plane parallel with the upper surface of the semiconductor substrate 11. In this comparative example, for the explanation of the semiconductor device 101b, an XY orthogonal coordinate axis system similar to that of Comparative Example 1 is also introduced. The gate electrodes 13 are arranged on the n type pillars 22b. The width of the gate electrodes 13 is the same the width of then type pillars 22b. However, as compared with Comparative Example 1, the width of the n type pillars 22b, p type pillars 22c, and gate electrodes 13 is narrower in Comparative Example 2. Descriptions regarding constitutions similar to those of the Comparative Example 1 are omitted.

In the semiconductor device 101b, the widths of the n type pillars 22b and the p type pillars 22c are narrower that Comparative Example 1. Even if the width of a depletion layer is narrower, the withstand voltage can be held. Therefore, the impurity concentration of the drift layer 22 is raised, thus lowering the resistance of the drift layer 22.

In the semiconductor device 101b, since the area where the gate electrodes 13 and the drain electrode 19 oppose to each other is narrow, the gate capacitance is small. If the width of the gate electrodes 13 is widened to increase the gate capacitance, the widths of the base layer 23 and the source layer 24 are narrowed, causing difficulty in the formation of the base layer 23 and the source layer 24. In addition, the connection of the source layer 24 and the source electrode 18 is difficult.

Modified Example 1 of Embodiment 1

Next, Modified Example 1 of Embodiment 1 will be explained.

Figure 5A:
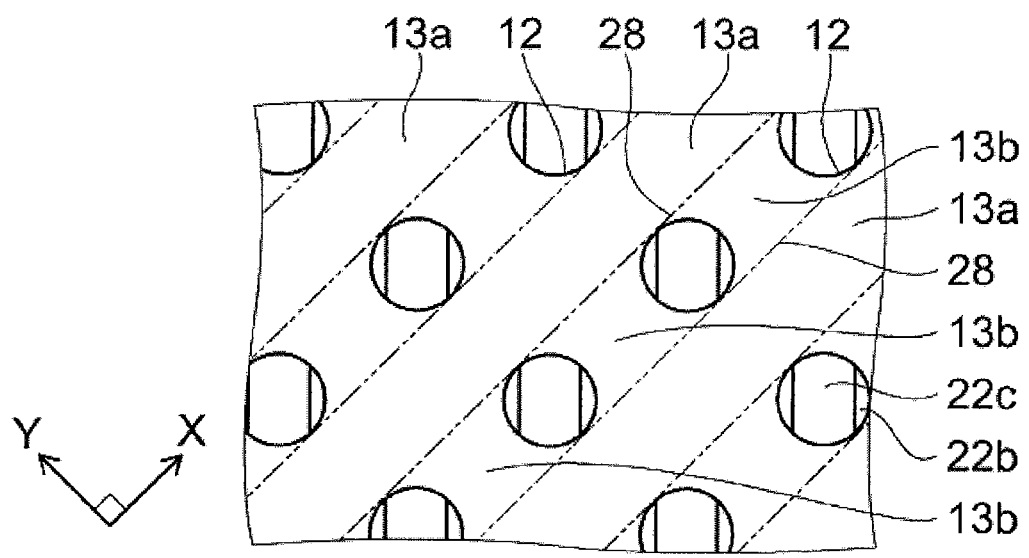
FIGS. 5A to 5C are plan views showing a semiconductor device of a first modified example of the first embodiment.

FIG. 5A is a plan view showing a semiconductor device of Modified Example 1 of Embodiment 1.

As shown in FIG. 5A, the shape of the contact holes 12 are circular shape from a top view. The contact holes 12 are arranged with in equal intervals along the X direction and the Y direction. In addition, the contact holes 12 are arranged so as to include an area right on top of the p type pillars 22c. In the case the contact holes 12 are arranged so as to be sandwiched by two straight lines 28 extending in the X direction, the connecting parts 13b are enclosed with the two straight lines 28 and the contact holes 12. The extended parts 13a are parts extending in the X direction in which the connecting parts 13b have been excluded from the gate electrodes 13. Other constitutions and operations in this modified example are similar to those of Embodiment 1.

Next, the effects of Modified Example 1 will be explained.

In this modified example, the shape of the contact holes 12 from a top view is a circular shape. Therefore, corner parts on which an electric field is apt to be concentrated are not formed. Thereby, the electric field concentration is relaxed, thus being able to improve the withstand voltage of the semiconductor device. Effects other than the effects described above in this modified example are similar to those of the Embodiment 1.

Modified Example 2 of Embodiment 1

Next, Modified Example 2 of Embodiment 1 will be explained.

Figure 5B:
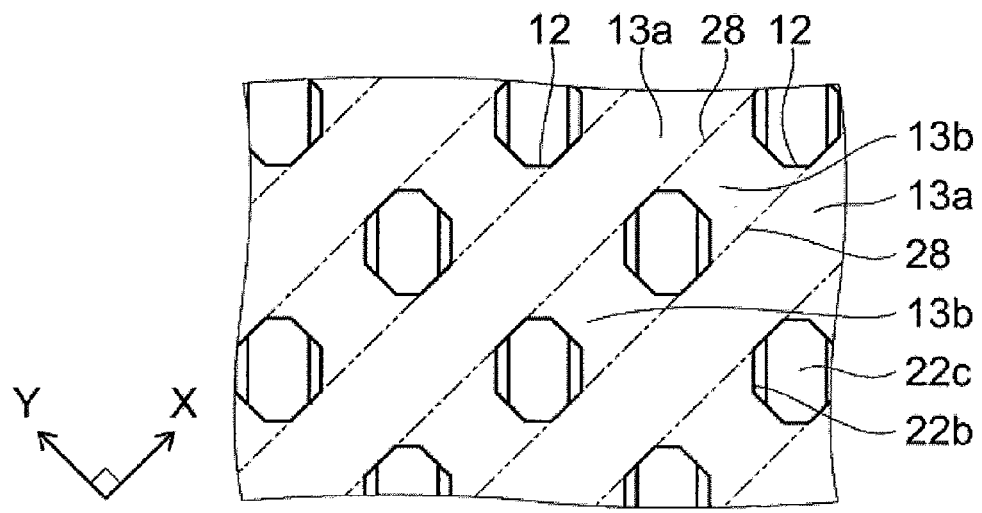

FIG. 5B is a plan view showing a semiconductor device of Modified Example 2 of Embodiment 1.

As shown in FIG. 5B, the shape of the contact holes 12 is an octagonal shape from a top view. The contact holes 12 are arranged at equal intervals along the X direction and the Y direction. In addition, the contact holes 12 are arranged so as to include an area right on top of the p type pillars 22c. In the case the contact holes 12 are arranged so as to be sandwiched by two straight lines 28 extending in the X direction, the connecting parts 13b have are enclosed with the two straight lines 28 and the contact holes 12. The extended parts 13a are parts extending in the X direction in which the connecting parts 13b have been excluded from the gate electrodes 13. Other constitutions and operations in this modified example are similar to those of Embodiment 1.

Next, the effects of this Modified Example will be explained.

In this modified example, each interior angle of the contact holes 12 from a top view is larger than 90°. Therefore, the electric field concentration can be relaxed, compared with the case in which the interior angle is 90° or smaller. Thereby, the withstand voltage of the semiconductor device can be improved. Effects other than the effects described above in this modified example are similar to those of Embodiment 1.

Modified Example 3 of Embodiment 1

Next, Modified Example 3 of Embodiment 1 will be explained.

Figure 5C:
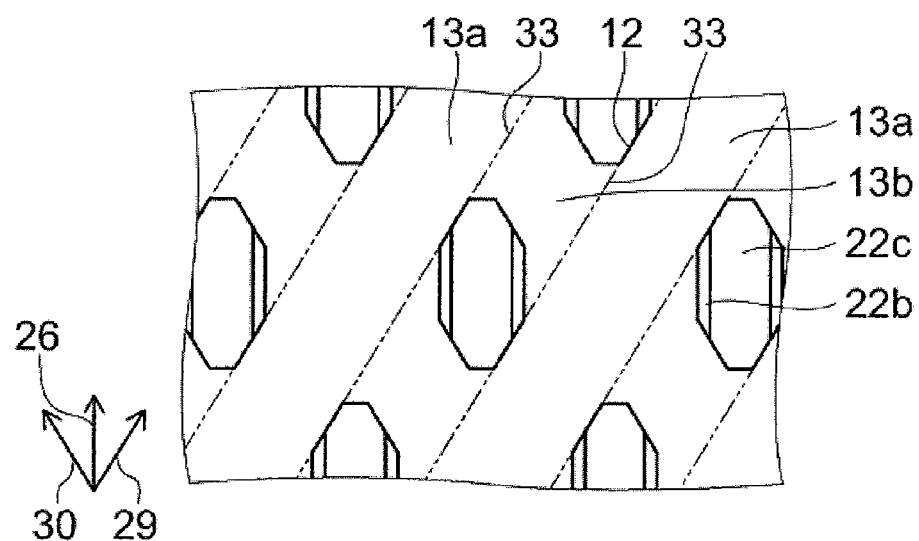

FIG. 5C is a plan view showing a semiconductor device of Modified Example 3 of Embodiment 1.

As shown in FIG. 5C, the shape of the contact holes 12 is an octagonal shape from a top view. The contact holes 12 are arranged so as to include an area right on top of the p type pillars 22c. The contact holes 12 are arranged at equal intervals along a direction 29 and a direction 30 whose angle to the extending direction 26 of the p type pillars 22c and then type pillars 22b is smaller than 45°. However, the shape of the contact holes is an octagonal shape extended in the direction 26, unlike FIG. 5B. As such, the extended parts 13a are arranged so as to extend in the direction 29. In the case that the contact holes 12 are arranged so as to be sandwiched by two straight lines 33 extending in a direction 29, the connecting parts 13b have a shape enclosed with the two straight lines 33 and the contact holes 12. The extended parts 13a are parts extending in the direction 29 in which the connecting parts 13b have been excluded from the gate electrodes 13.

Other constitutions, operations, and effect described above in this modified example are similar to those of Embodiment 1.

Embodiment 2

Next, Embodiment 2 will be explained.

Figure 6A:
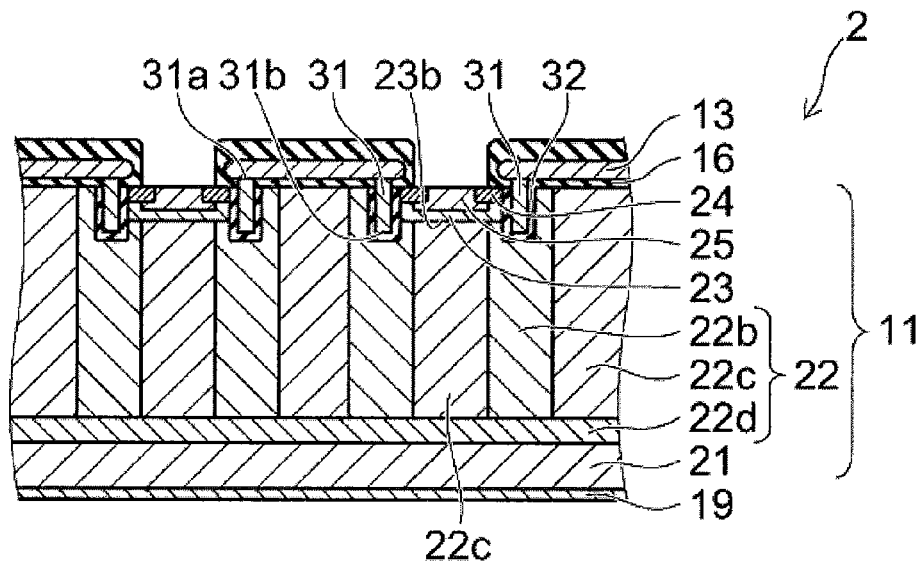
FIG. 6A is across section showing a semiconductor device according to a second embodiment.
Figure 6B:
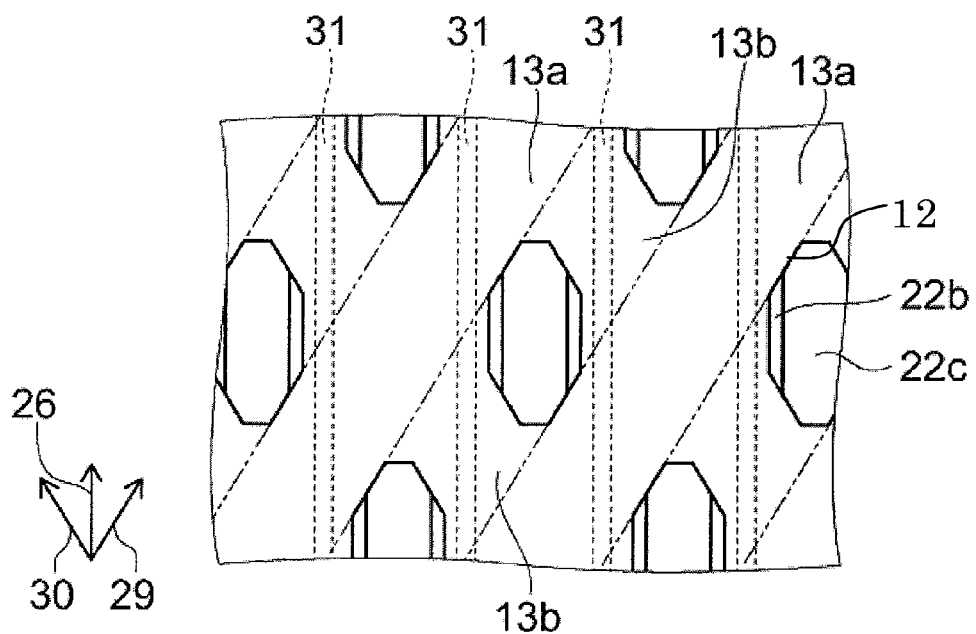
FIG. 6B and FIG. 6C are plan views showing the semiconductor device of the second embodiment.
Figure 6C:
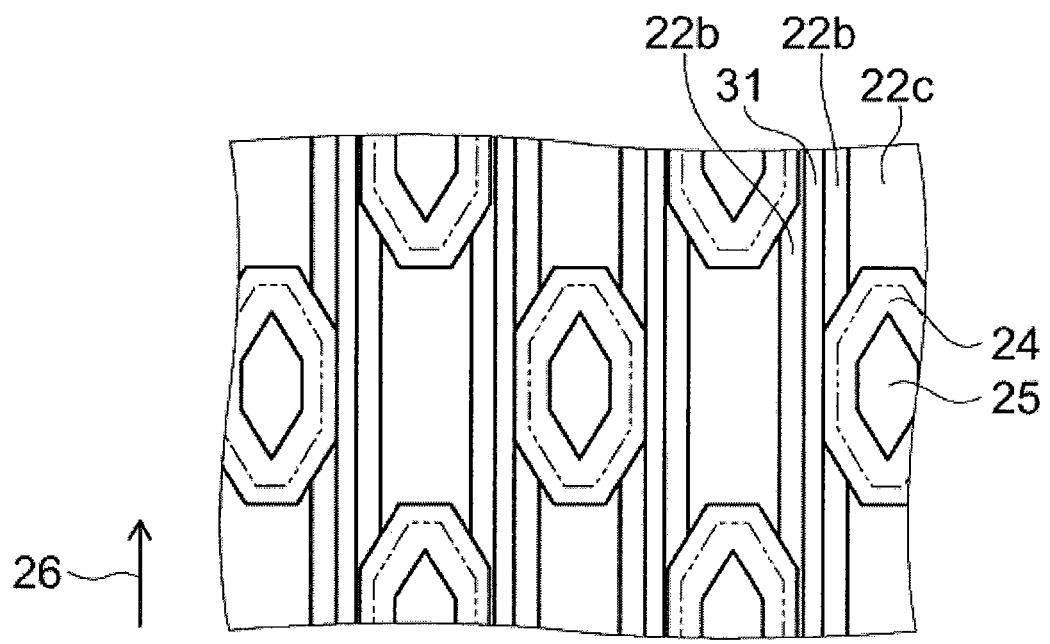

FIG. 6A is a cross section showing a semiconductor device of Embodiment 2, and FIG. 6B and FIG. 6C are plan views showing the semiconductor device of Embodiment 2.

As shown in FIG. 6A through FIG. 6C, trench gate electrodes 31 and a trench gate insulating film 32 are installed on a semiconductor device 2 of this embodiment.

The trench gate electrodes 31 are arranged along the extending direction 26 of the n type pillars 22b and the p type pillars 22c in the upper part of the n type pillars 22b. Upper ends 31a of the trench gate electrodes 31 are connected to the gate electrodes 13. Lower ends 31b of the trench gate electrodes 31 are lower than a lower surface 23b of the base layer 23.

The trench gate insulating film 32 is disposed between the trench gate electrodes 31 and the semiconductor substrate 11. The edge of the base layer 23 contacts the trench gate insulating film 32. The edge of the source layer 24 contacts the trench gate insulating film 32.

Referring to FIG. 6B, the extended parts 13a in the gate electrodes 13 extend in the direction 29 whose angle in the direction 26 is smaller than 45° in a plane parallel with the semiconductor substrate 11. The connecting parts 13b in the gate electrodes 13 extend in the direction 30 whose angle in the direction 26 is smaller than 45°. The shape of the contact holes 12 is an octagonal shape. The contact holes 12 are arranged with an equal interval along the direction 29 and the direction 30. The contact holes 12 are arranged so as to include an area right on top of the p type pillars 22c. Other constitutions of in this embodiment are similar to those of the Embodiment 1.

Next, the operations of the semiconductor device 2 of this embodiment will be explained.

In this embodiment, an inversion layer is formed in the vicinity of the gate insulating film 16 in the base layer 23 and in the vicinity of the trench gate insulating film 32 in the base layer 23.

Operations other than the operation described above in this embodiment are similar to those of the Embodiment 1.

Next, the effects of this embodiment will be explained.

According to this embodiment, since the inversion layer is formed in the vicinity of the trench gate insulating film 32 in the base layer 23, the sectional area of a current path can be increased. Therefore, a high-voltage can be held while lowering the on-state resistance of the semiconductor device 2. Effects other than the effect described above in this embodiment are similar to those of the Embodiment 1.

According to the embodiments explained above, semiconductor devices that can hold a high-voltage while lowering the on-state resistance can be provided.

While certain embodiments have been described, these embodiments have been presented by way of example only, and are not intended to limit the scope of the inventions. Indeed, the novel embodiments described herein may be embodied in a variety of other forms. Furthermore, various omissions, substitutions, and changes in the form of the embodiments described herein may be made without departing from the spirit of the inventions. The accompanying claims and their equivalents are intended to cover such forms or modifications as would fall within the scope and spirit of the inventions. Furthermore, the above described embodiments may be carried out by combining embodiments.

What is claimed is:

1. A semiconductor device, comprising:
   a semiconductor substrate;
   a plurality of gate electrodes that are disposed on the semiconductor substrate, the plurality of gate electrodes including a plurality of extended parts extending in a first direction in a plane parallel with the semiconductor substrate;
   a gate insulating film disposed between the semiconductor substrate and the plurality of gate electrodes;
   a first electrode connected to an upper surface of the semiconductor substrate; and
   a second electrode connected to a lower surface of the semiconductor substrate, wherein the semiconductor substrate includes:
   a first conductive type first semiconductor layer connected to the second electrode;
   a second semiconductor layer including a plurality of first conductive type pillars and second conductive type pillars that are disposed on the first semiconductor layer, extending in a second direction in the plane parallel with the semiconductor substrate and in a third direction orthogonal to the plane of the semiconductor substrate, the first and second conductive type pillars arranged adjacent to each other in an alternate manner, wherein the first direction forms an oblique angle with the second direction;
   a second conductive type third semiconductor layer that is disposed in a region including a gap between areas right under one of the gate electrodes and the second semiconductor layer, where an edge of the second conductive type third semiconductor layer is positioned in an area right under the gate electrode from a top view; and
   a first conductive type fourth semiconductor layer that is disposed in an area right on the third semiconductor layer and connected to the first electrode,
   wherein an edge of the first conductive type fourth semiconductor layer is positioned in an area right under one of the gate electrodes from a top view.

2. The semiconductor device according to claim 1, further comprising:
   a trench gate electrode, which is disposed on an upper part of the first conductive type pillars, wherein an upper end thereof is connected to the gate electrode.

3. The semiconductor device according to claim 2, further comprising:
   a trench gate insulating film disposed between the trench gate electrode and the semiconductor substrate.

4. The semiconductor device according to claim 3, wherein a lower end of the third semiconductor layer is higher than a lower end of the trench gate electrode.

5. The semiconductor device according to claim 4, wherein an edge of the trench gate electrode is in contact with the trench gate insulating film.

6. The semiconductor device according to claim 5, wherein an edge of the fourth semiconductor layer is in contact with the trench gate insulating film.

7. The semiconductor device according to claim 1, further comprising:
   a second conductive type fifth semiconductor layer that penetrates the fourth semiconductor layer, and has an effective impurity concentration that is higher than an effective impurity concentration of the third semiconductor layer.

8. The semiconductor device according to claim 7, wherein the gate insulating film is also connected to the fifth semiconductor layer.

9. The semiconductor device according to claim 1, wherein the plurality of the gate electrodes include:
   a plurality of connecting parts for connecting the extended parts adjacent to each other, the plurality of connecting parts extending in a fourth direction in a plane parallel with the semiconductor substrate, the fourth direction forming an oblique angle with the second direction.

10. The semiconductor device according to claim 9, wherein
    the extended parts are arranged at equal intervals in the fourth direction.

11. The semiconductor device according to claim 10, wherein
    the plurality of the connecting parts are disposed between the respective extended parts adjacent to each other and arranged at equal intervals along the first direction.

12. The semiconductor device according to claim 9, wherein
    a shape of a contact hole enclosed by adjacent extended parts and adjacent connecting parts is a polygonal shape from a top view.

13. The semiconductor device according to claim 12, wherein
    the shape of the contact hole is a rectangular shape from a top view.

14. The semiconductor device according to claim 12, wherein
    the shape of the contact hole is an octagonal shape from a top view.

15. The semiconductor device according to claim 9, wherein
    a shape of a contact hole enclosed by adjacent extended parts and adjacent connecting parts is a circular shape from a top view.

16. The semiconductor device according to claim 12, wherein
each interior angle of the contact hole is larger than 90°.

17. A method for manufacturing a semiconductor substrate, comprising:
- disposing a plurality of gate electrodes on the semiconductor substrate, the plurality of gate electrodes including a plurality of extended parts extending in a first direction in a plane parallel with the semiconductor substrate;
- disposing a gate insulating film between the semiconductor substrate and the plurality of gate electrodes;
- connecting a first electrode to an upper surface of the semiconductor substrate; and
- connecting a second electrode to a lower surface of the semiconductor substrate,
- wherein the semiconductor substrate includes:
- a first conductive type first semiconductor layer connected to the second electrode;
- a second semiconductor layer including a plurality of first conductive type pillars and second conductive type pillars that are disposed on the first semiconductor layer, extending in a second direction in the plane parallel with the semiconductor substrate and in a third direction orthogonal to the plane of the semiconductor substrate, the first and second type conductive pillars arranged adjacent to each other in an alternate manner, wherein the first direction forms an oblique angle with the second direction;
- a second conductive type third semiconductor layer that is disposed in a region including a gap between areas right under one of the gate electrodes and the second semiconductor layer, where an edge of the second conductive type semiconductor layer is positioned in an area right under the gate electrode from a top view; and
- a first conductive type fourth semiconductor layer that is disposed in an area right on the third semiconductor layer and connected to the first electrode,
- wherein an edge of the first conductive type fourth semiconductor layer is positioned in an area right under one of the gate electrodes from a top view.

18. The method of claim 17, wherein the plurality of gate electrodes include
a plurality of connecting parts for connecting the extended parts adjacent to each other, the plurality of connecting parts extending in a fourth direction in a plane parallel with the semiconductor substrate, the fourth direction forming an oblique angle with the second direction.

19. The method of claim 18, wherein
a shape of a contact hole enclosed by adjacent extended parts and adjacent connecting parts is a polygonal shape from a top view.

20. The method of claim 19, wherein
the shape of the contact hole is one of a rectangular shape or an octagonal shape from a top view.

\* \* \* \* \*